(12) United States Patent
Itoh

(10) Patent No.: US 8,405,224 B2
(45) Date of Patent: Mar. 26, 2013

(54) SEMICONDUCTOR DEVICE COMPRISING MULTILAYER INTERCONNECT STRUCTURE WITH OVERLAPPING VIAS

(75) Inventor: Kazuo Itoh, Osaka (JP)

(73) Assignee: Panasonic Corporation, Osaka (JP)

( * ) Notice: Subject to any disclaimer, the term of this patent is extended or adjusted under 35 U.S.C. 154(b) by 44 days.

(21) Appl. No.: 12/982,064

(22) Filed: Dec. 30, 2010

(65) Prior Publication Data

US 2011/0089574 A1 Apr. 21, 2011

Related U.S. Application Data

(63) Continuation of application No. PCT/JP2010/002935, filed on Apr. 22, 2010.

(30) Foreign Application Priority Data

May 19, 2009 (JP) ................... 2009-120613

(51) Int. Cl.
*H01L 23/48* (2006.01)
*H01L 23/52* (2006.01)
*H01L 29/40* (2006.01)
(52) U.S. Cl. ............ 257/775; 257/758; 257/774
(58) Field of Classification Search ............. 257/758, 257/774, 775
See application file for complete search history.

(56) References Cited

U.S. PATENT DOCUMENTS

| 6,555,911 B1 | 4/2003 | Matsubara et al. |
| 2001/0002713 A1 | 6/2001 | Goda et al. |
| 2008/0142975 A1* | 6/2008 | Ning ............ 257/758 |

FOREIGN PATENT DOCUMENTS

| JP | 04-162652 | 6/1992 |
| JP | 07-231172 | 8/1995 |
| JP | 2001-156168 | 6/2001 |
| JP | 2001-160591 | 6/2001 |
| JP | 2001-168304 | 6/2001 |

* cited by examiner

*Primary Examiner* — Kimberly Rizkallah
*Assistant Examiner* — Errol Fernandes
(74) *Attorney, Agent, or Firm* — McDermott Will & Emery LLP

(57) ABSTRACT

A semiconductor device having a multilayer interconnect structure allowing heat in an interconnect layer at an intermediate level to be effectively dissipated is provided. A lower-layer interconnect (13), an intermediate interconnect (23), an upper-layer interconnect (33), a first contact via (15) formed to electrically connect the lower-layer interconnect (13) to the intermediate interconnect (23), and a second contact via (25) formed to electrically connect the intermediate interconnect (23) to the upper-layer interconnect (33) are provided. When viewed from above, the first and second contact vias (15, 25) both have a rectangular shape with their long sides extending in the same direction, and overlap with each other.

8 Claims, 12 Drawing Sheets

FIG.1
(a) M4
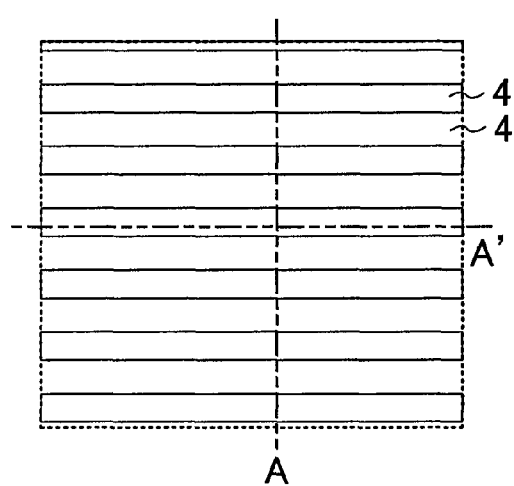
(b) M3
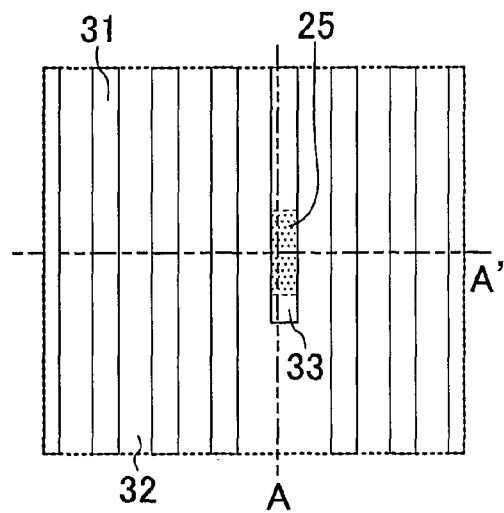
(c) M2
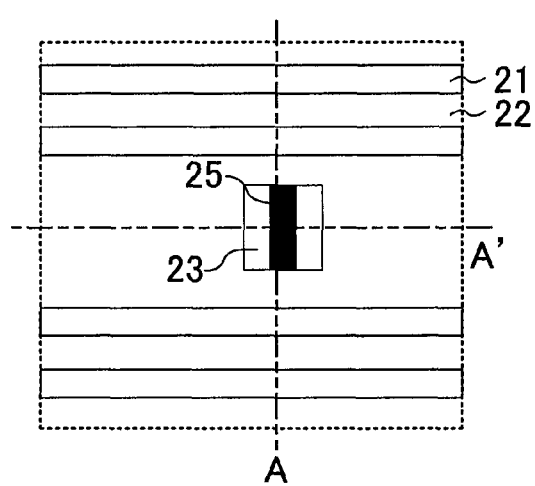
(d) M1
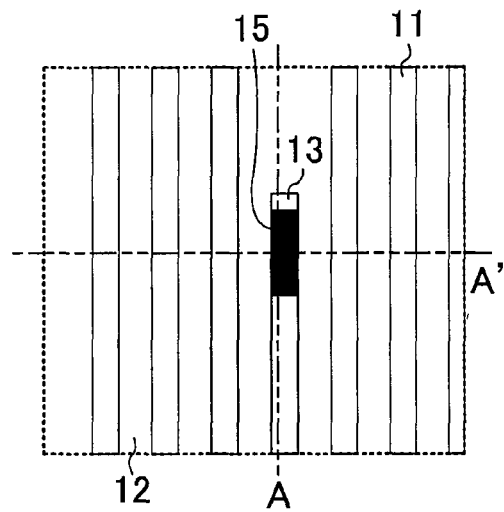

FIG.5
(a)
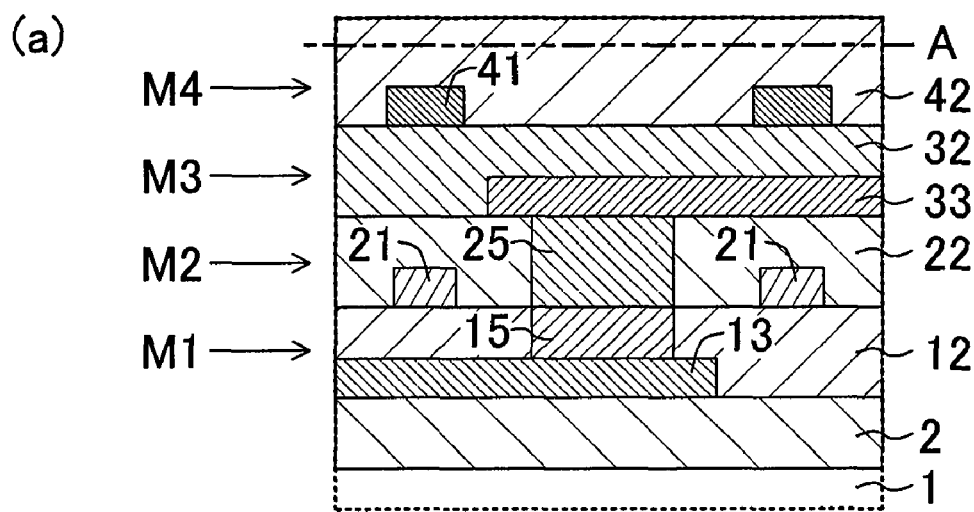
(b)
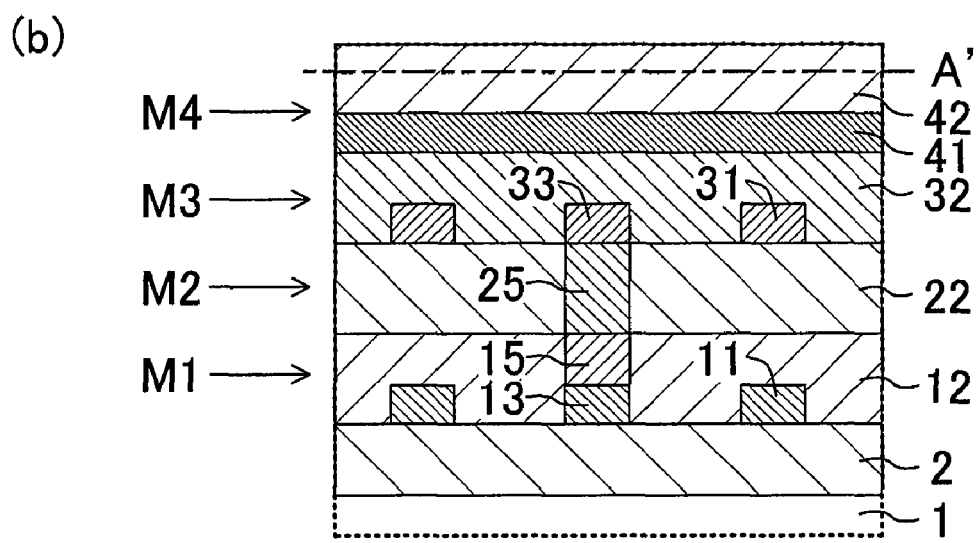

FIG.7
(a)
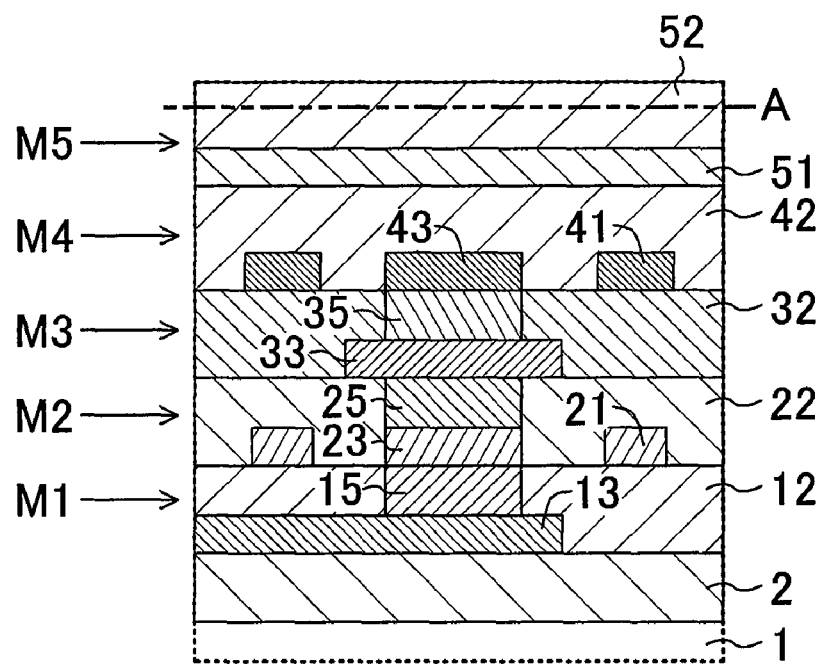
(b)
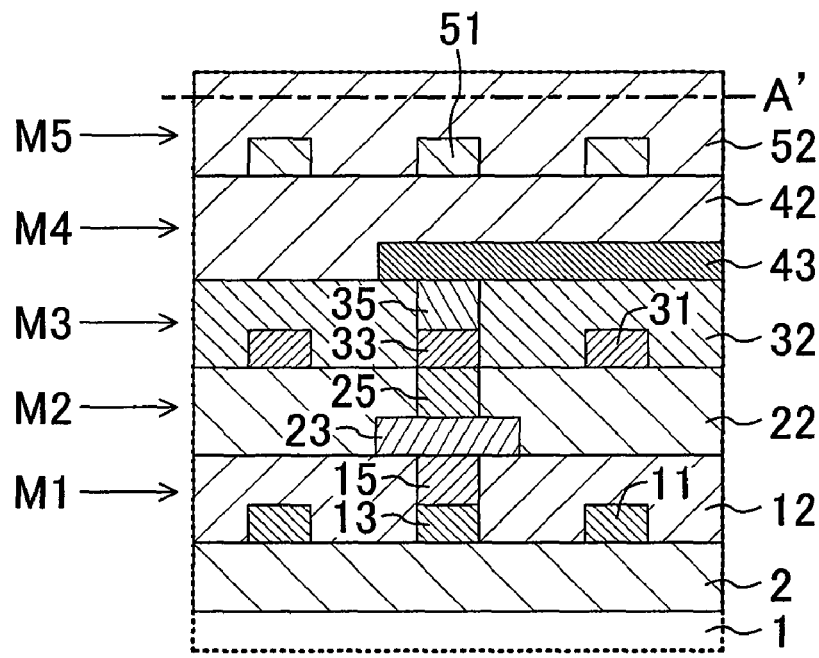

FIG.9
(a)
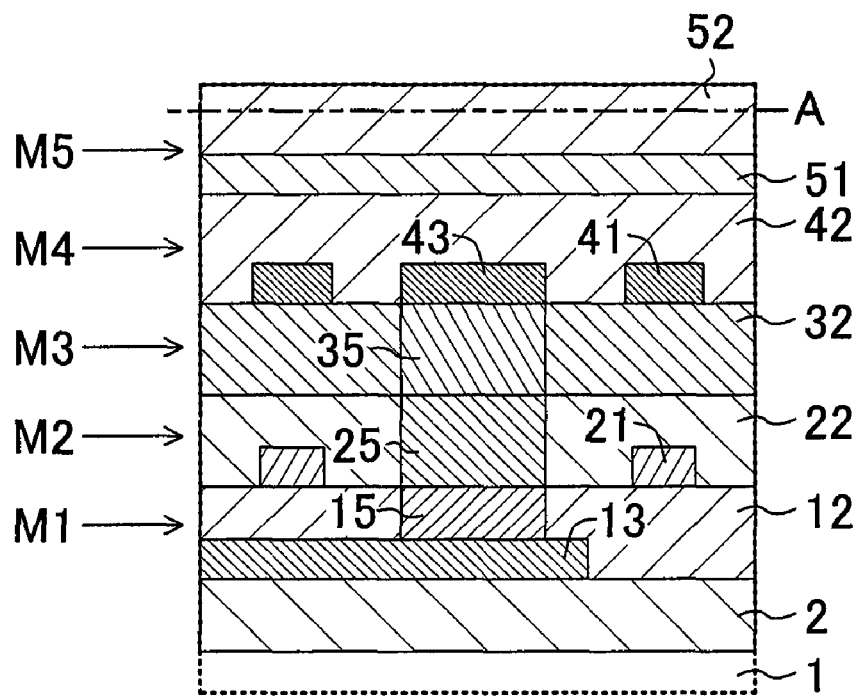
(b)
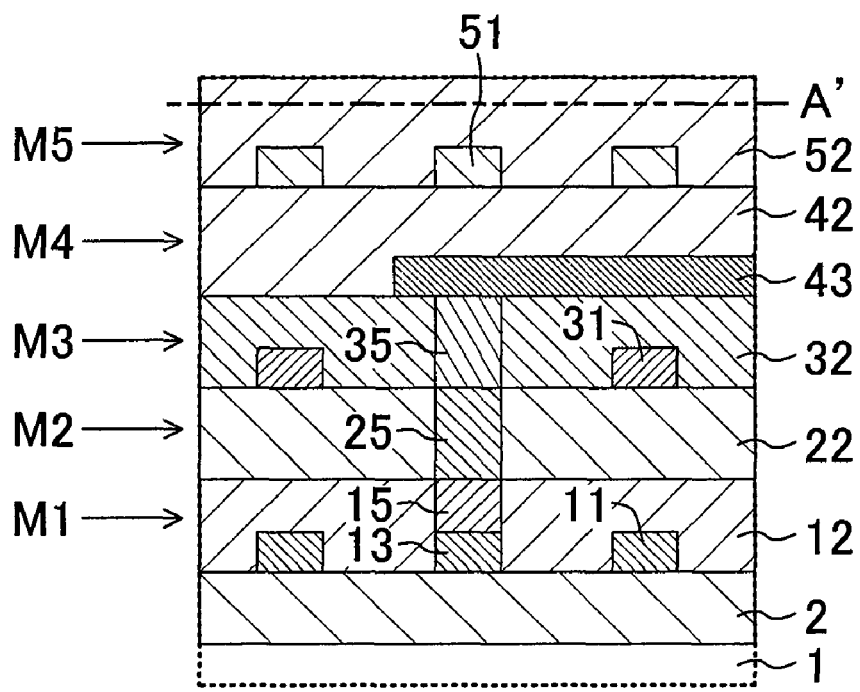

FIG.11
(a)
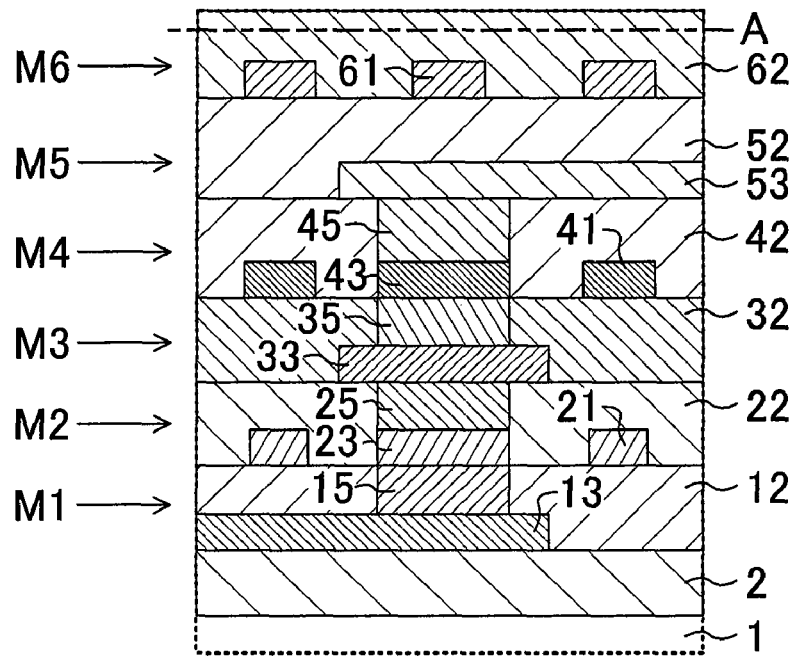
(b)
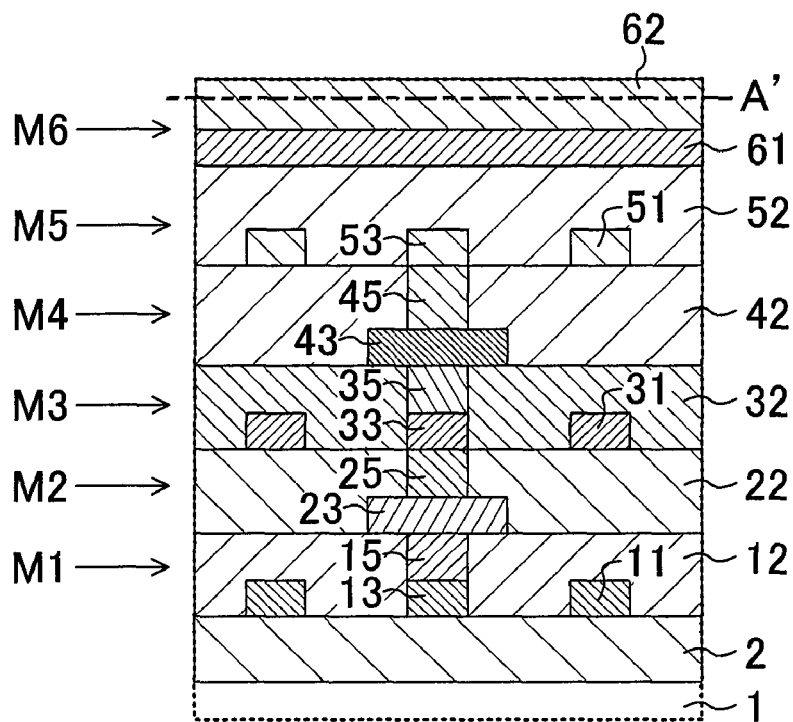

FIG.12
(a) M6
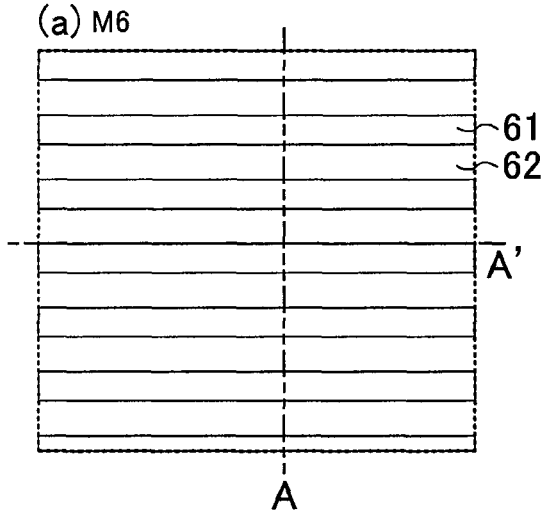
(b) M5
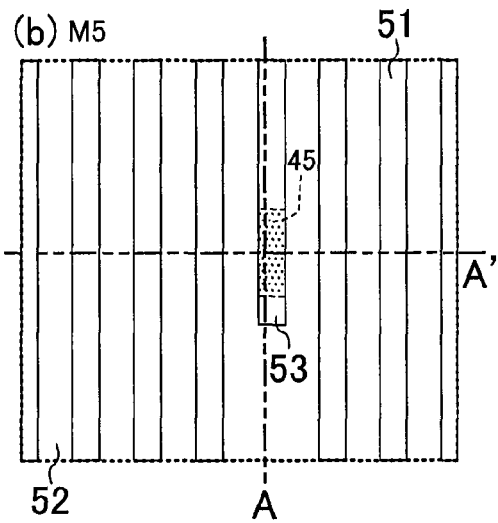
(c) M4
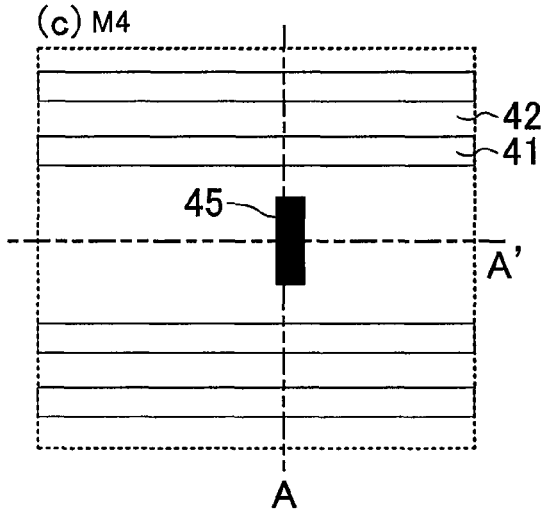
(d) M3
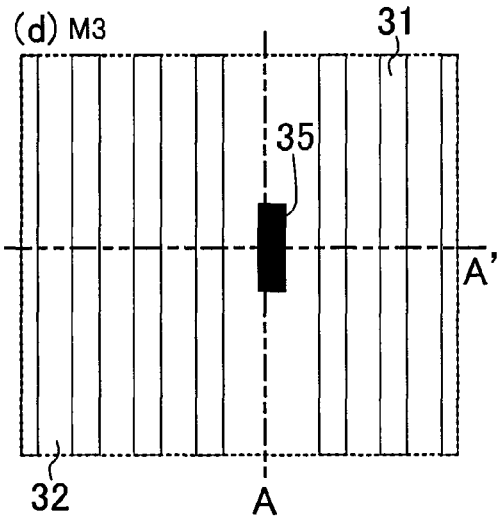
(e) M2
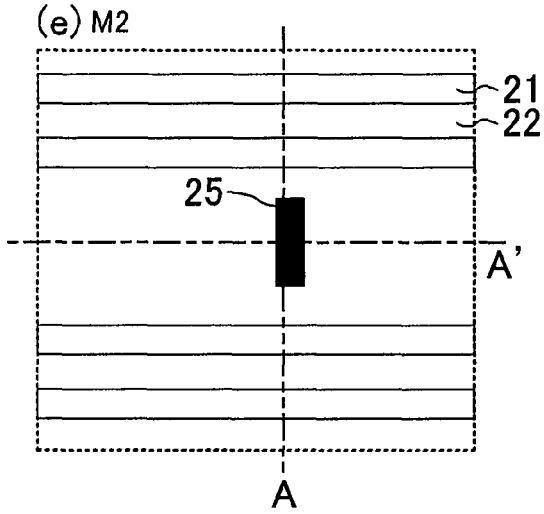
(f) M1
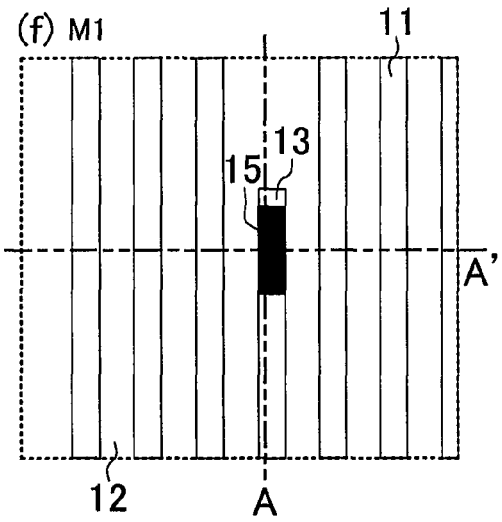

FIG.13
(a)
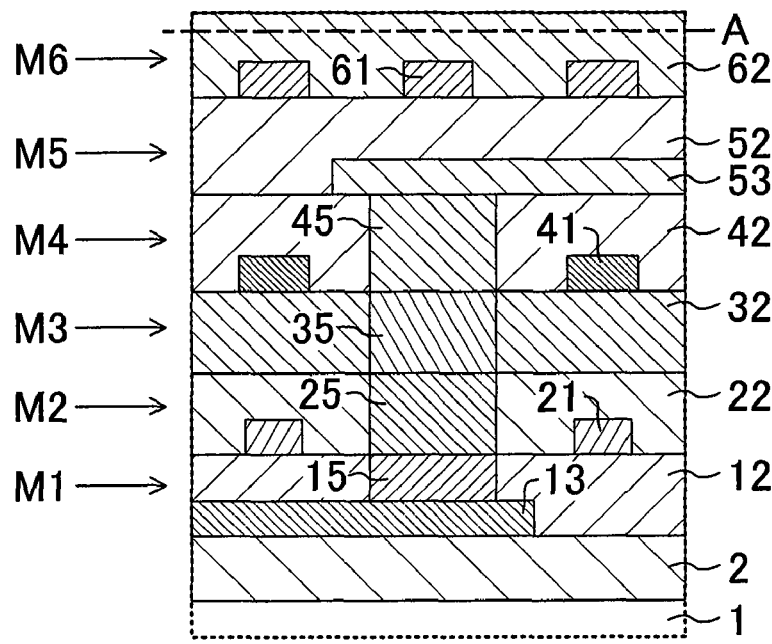
(b)
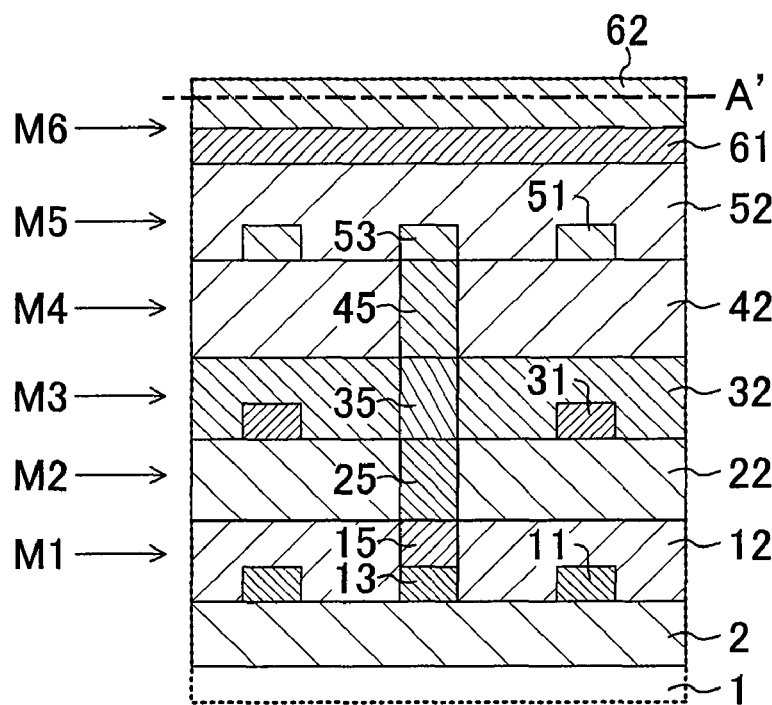

SEMICONDUCTOR DEVICE COMPRISING MULTILAYER INTERCONNECT STRUCTURE WITH OVERLAPPING VIAS

CROSS-REFERENCE TO RELATED APPLICATION

This is a continuation of PCT International Application PCT/JP2010/002935 filed on Apr. 22, 2010, which claims priority to Japanese Patent Application No. 2009-120613 filed on May 19, 2009. The disclosures of these applications including the specifications, the drawings, and the claims are hereby incorporated by reference in their entirety.

BACKGROUND ART

The present disclosure relates to semiconductor devices having multilayer interconnect structures.

As an example of multilayer interconnect structures of semiconductor devices, Japanese Patent Publication No. 2001-160591 discloses a configuration in which via contacts are provided on a pair of adjacent lower-layer interconnects such that the via contacts are offset relative to each other in the interconnect direction. In semiconductor processes of recent years, in order to reduce interconnect delay, the technique of purposely forming a pore in an insulating material provided between interconnects is used to reduce the relative dielectric constant between the interconnects. The technique of Japanese Patent Publication No. 2001-160591 prevents defects due to short-circuiting in multilayer interconnect structures having a pore purposely formed in an insulating layer between interconnects.

SUMMARY

In conventional semiconductor chips, the operating frequency is as low as about several tens of megahertz, and a current passing through an interconnect generates little Joule heat. Moreover, the width of the interconnect is large, and the diameter of a contact via is large. Thus, the interconnect and the contact via sufficiently provide advantages as a heat dissipation plate and a heat propagation line. Further, the number of interconnect layers is small, and the thickness of a chip is small. Thus, a problem that the heat is not dissipated rarely arises.

However, as miniaturization technology progresses, the problem of generating heat has become significant. That is, the operating frequency of the semiconductor chips has dramatically increased to as high as about several hundreds of megahertz or higher, and Joule heat generated due to a current passing through an interconnect has substantially been increased. Moreover, the interconnect having heat dissipation effect has become narrower, and the diameter of the contact via has become smaller, so that fewer advantages as a heat dissipation plate and a heat propagation line have been obtained. Further, in addition to implementation of multilayer interconnection to increase the thickness of the chips, a pore has been formed in an interconnect insulating layer as described above to lower the dielectric constant so that being low-k is pursued. As a result, the thermal conductivity has further been degraded.

Since dissipation destinations of Joule heat generated in a multilayer interconnect structure are only surfaces of a semiconductor chip, the Joule heat is transferred to a top layer and a bottom layer, and then released. Thus, due to the reduction in heat dissipation effect and in thermal conductivity as described above, heat in an interconnect layer at an intermediate level in particular is less dissipated, so that the heat stays. This problem may cause a poor yield and property degradation such as deformation, breaking of interconnects, and short-circuiting.

It is an objective of the present disclosure to provide a semiconductor device having a multilayer interconnect structure allowing effective dissipation of heat from an interconnect layer at an intermediate level in particular.

A first aspect of the present invention is a semiconductor device having a multilayer interconnect structure which is formed above a substrate and includes first to Nth interconnect layers, where N is an integer equal to or larger than 4, stacked from the substrate side in this order, the semiconductor device including: a lower-layer interconnect formed in the first interconnect layer; an intermediate interconnect formed in the second interconnect layer; an upper-layer interconnect formed in the (N−1)th interconnect layer; a first contact via formed to electrically connect the lower-layer interconnect to the intermediate interconnect; and a second contact via formed to electrically connect the intermediate interconnect to the upper-layer interconnect; wherein when viewed from above, the first contact via and the second contact via both have a rectangular shape with their long sides extending in a same first direction, and overlap with each other.

Moreover, a second aspect of the present invention is a semiconductor device having a multilayer interconnect structure which is formed above a substrate and includes first to Nth interconnect layers, where N is an integer equal to or larger than 4, stacked from the substrate side in this order, the semiconductor device including: a lower-layer interconnect formed in the first interconnect layer; an upper-layer interconnect formed in the (N−1)th interconnect layer; and first and second contact vias formed to electrically connect the lower-layer interconnect to the upper-layer interconnect, wherein when viewed from above, the first contact via and the second contact via both have a rectangular shape with their long sides extending in a same first direction, and overlap with each other.

In these aspects of the present invention, a stack structure in which a lower-layer interconnect in a first interconnect layer is electrically connected to an upper-layer interconnect in a (N−1)th interconnect layer is implemented. In the stack structure, when viewed from above, a first contact via and a second contact via both have a rectangular shape with their long sides extending in the same direction, and overlap with each other. Thus, as for the heat dissipation effect, a structure is implemented as if a wide heat dissipation line were provided between the lower-layer interconnect and the upper-layer interconnect, thereby increasing the thermal conductivity between levels. Therefore, the effect of dissipating heat from an intermediate level at which heat is more likely to stay in the multilayer interconnect structure, to the first interconnect layer and the (N−1)th interconnect layer under and over the intermediate level is improved. Therefore, heat is less likely to stay, so that it is possible to improve the yield of semiconductor devices and to limit property degradation to a lesser extent.

In the present invention, in the stack structure, the rectangular contact vias are arranged so that they are aligned in the same direction to overlap with each other. Thus, it is possible to improve the effect of dissipating heat from the intermediate level of the multilayer interconnect structure. Therefore, the yield of semiconductor devices can be improved, and the property degradation can be limited to a lesser extent.

BRIEF DESCRIPTION OF THE DRAWINGS

FIGS. 1A and 1D are plan views illustrating a configuration of a semiconductor device according to a first embodiment.

FIGS. 5A and 5B are cross-sectional views illustrating the configuration of the semiconductor device according to the second embodiment.

FIGS. 7A and 7B are cross-sectional views illustrating the configuration of the semiconductor device according to the third embodiment.

FIGS. 9A and 9B are cross-sectional views illustrating the configuration of the semiconductor device according to the fourth embodiment.

FIGS. 11A and 11B are cross-sectional views illustrating the configuration of the semiconductor device according to the fifth embodiment.

FIGS. 12A-12F are plan views illustrating a configuration of a semiconductor device of a sixth embodiment.

FIGS. 13A and 13B are cross-sectional views illustrating the configuration of the semiconductor device according to the sixth embodiment.

DETAILED DESCRIPTION

Embodiments of the present invention will be described below with reference to the drawings.

First Embodiment

A semiconductor device according to a first embodiment has a multilayer interconnect structure formed above a substrate. The multilayer interconnect structure includes a first interconnect layer, a second interconnect layer, a third interconnect layer, and a fourth interconnect layer which are stacked from the substrate side in this order.

Figure 2:
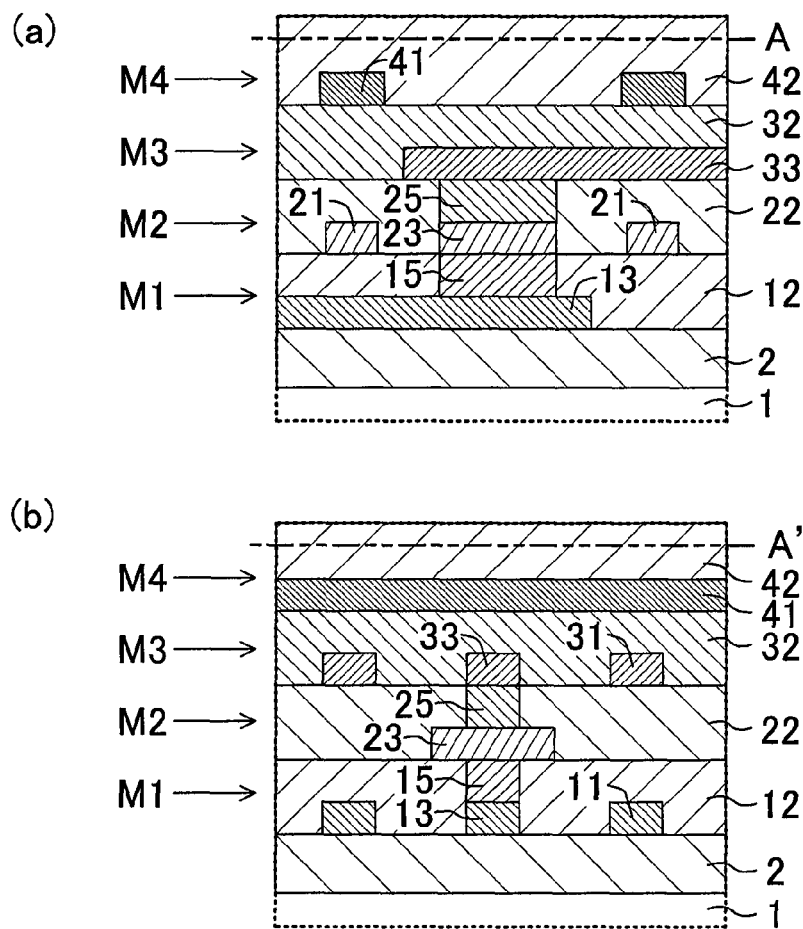
FIGS. 2A and 2B are cross-sectional views illustrating the configuration of the semiconductor device according to the first embodiment.

FIGS. 1A-1D are plan views illustrating a configuration of the semiconductor device according to the present embodiment, wherein FIGS. 1A-1D illustrate configurations of the fourth interconnect layer (M4), the third interconnect layer (M3), the second interconnect layer (M2), and the first interconnect layer (M1), respectively. FIGS. 2A and 2B are cross-sectional views of the semiconductor device of FIGS. 1A-1D, wherein FIG. 2A is a cross-sectional view taken along the line A, and FIG. 2B is a cross-sectional view taken along the line A'.

In FIGS. 2A and 2B, reference numeral 1 denotes a well region forming a diffusion layer of a transistor, the well region being made of, for example, silicon on a surface of the substrate. Reference numeral 2 denotes an insulating layer made of, for example, silicon oxide to electrically isolate the well region 1 from the interconnect layers. On the insulating layer 2, the four interconnect layers M1-M4 are formed.

As illustrated in FIGS. 1A-1D, 2A, and 2B, interconnects 11, 21, 31, 41 made of, for example, Cu are provided in the interconnect layers M1-M4, respectively. Note that in the present embodiment, the interconnect direction is the longitudinal direction for the interconnect layers M1, M3, and is the transverse direction for the interconnect layers M2, M4.

Moreover, in order to electrically isolate the interconnects from each other, insulating layers 12, 22, 32, 42 made of, for example, silicon oxide are provided in the interconnect layers M1-M4, respectively.

Furthermore, the first interconnect layer M1 is provided with a first contact via 15 made of, for example, Cu, and the second interconnect layer M2 is provided with a second contact via 25 made of, for example, Cu. The first contact via 15 is formed to electrically connect a lower-layer interconnect 13 formed in the first interconnect layer M1 to an intermediate interconnect 23 formed in the second interconnect layer M2. The second contact via 25 is formed to electrically connect the intermediate interconnect 23 to an upper-layer interconnect 33 formed in the third interconnect layer M3. Note that the first contact via 15 may be formed in the second interconnect layer M2, or the second contact via 25 may be formed in the third interconnect layer M3.

When viewed from above (in other words, when viewed in a direction perpendicular to the surface of the substrate), the first and second contact vias 15, 25 both have a rectangular shape, and their long sides extend in the same direction. In the present embodiment, the direction in which the long sides extend (first direction) is the same as the interconnect direction of the first and third interconnect layers M1, M3, and is orthogonal to the interconnect direction of the second interconnect layer M2. Moreover, when viewed from above, the first and second contact vias 15, 25 overlap with each other. In the present embodiment, the first and second contact vias 15, 25 are identical in length of their long sides and their short sides, and overlap with each other almost entirely.

Moreover, when viewed from above, the intermediate interconnect 23 further extends beyond the first and second contact vias 15, 25 in their short-side direction, i.e., in a direction orthogonal to their long-side direction (second direction).

That is, the lower-layer interconnect 13, the first contact via 15, the intermediate interconnect 23, the second contact via 25, and the upper-layer interconnect 33 are stacked in this order, and are electrically connected to each other, thereby implementing a so-called stack structure.

As described above, in the present embodiment, in the stack structure in which the lower-layer interconnect 13 in the first interconnect layer M1 is connected to the upper-layer interconnect 33 in the third interconnect layer M3, the first and second contact vias 15, 25 having a rectangular shape are arranged so that they are aligned in the same direction to overlap with each other. Thus, as for heat dissipation effect, a structure is implemented as if a wide heat dissipation line were provided between the lower-layer interconnect 13 and the upper-layer interconnect 33, thereby increasing the thermal conductivity between levels. This improves the effect of dissipating heat from the second interconnect layer M2 at an intermediate level at which heat is more likely to stay in the multilayer interconnect structure to the first interconnect layer M1 and to the third interconnect layer M3.

Moreover, since the intermediate interconnect 23 further extends beyond the first and second contact vias 15, 25, the thermal conductivity is further increased, further improving the heat dissipation effect by the stack structure.

Figure 3:
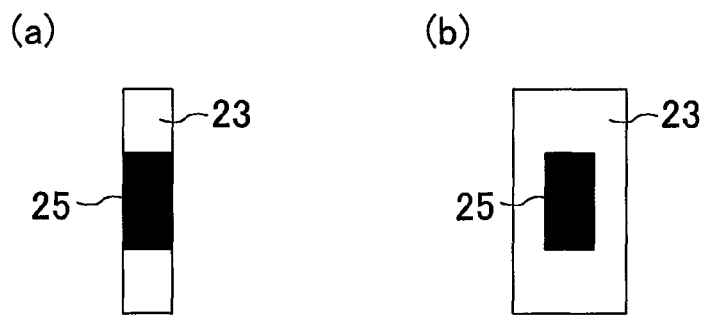
FIGS. 3A and 3B are plan views illustrating examples of intermediate interconnects in other shapes.
Figure 4:
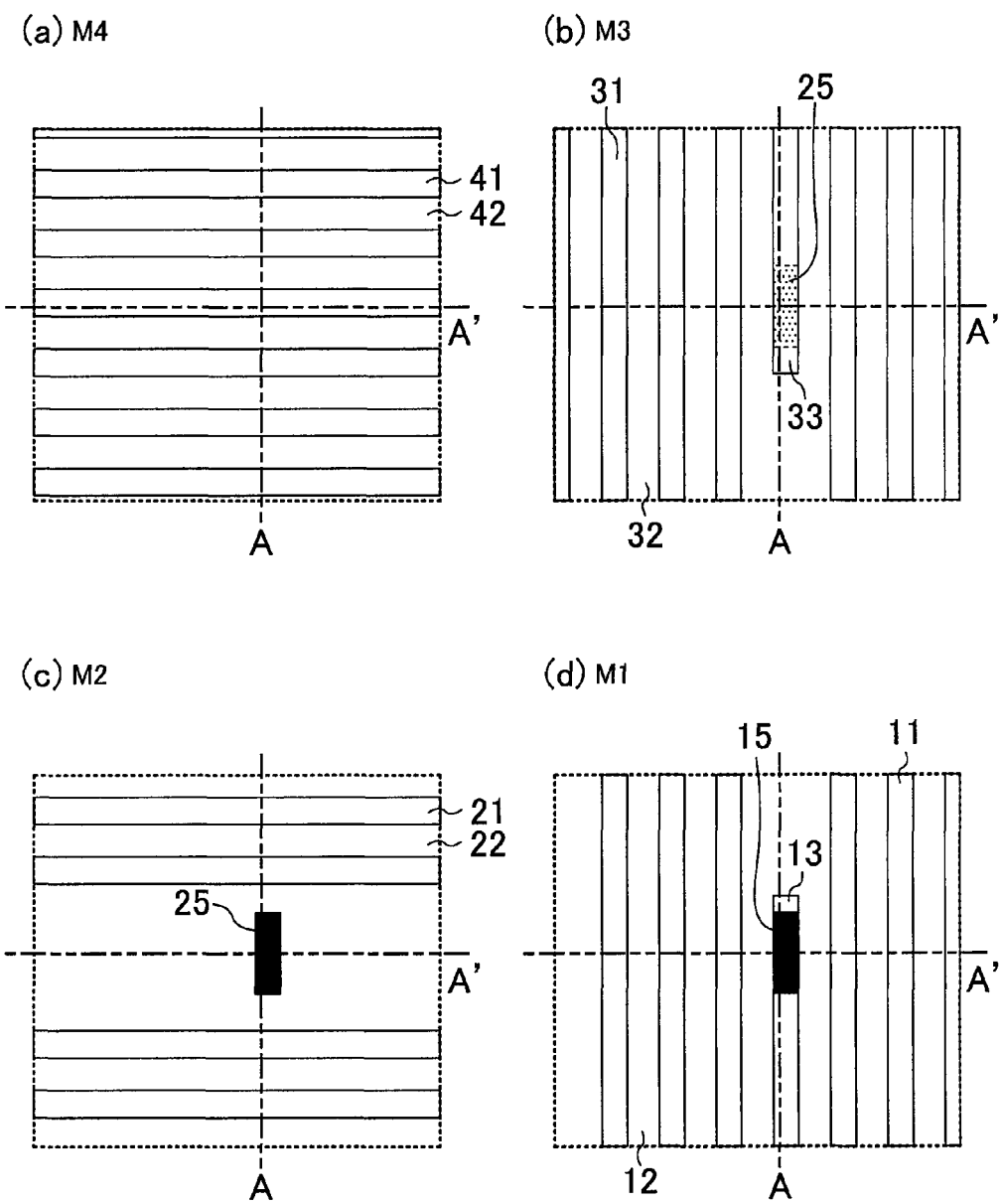
FIGS. 4A-4D are plan views illustrating a configuration of a semiconductor device according to a second embodiment.
Figure 6:
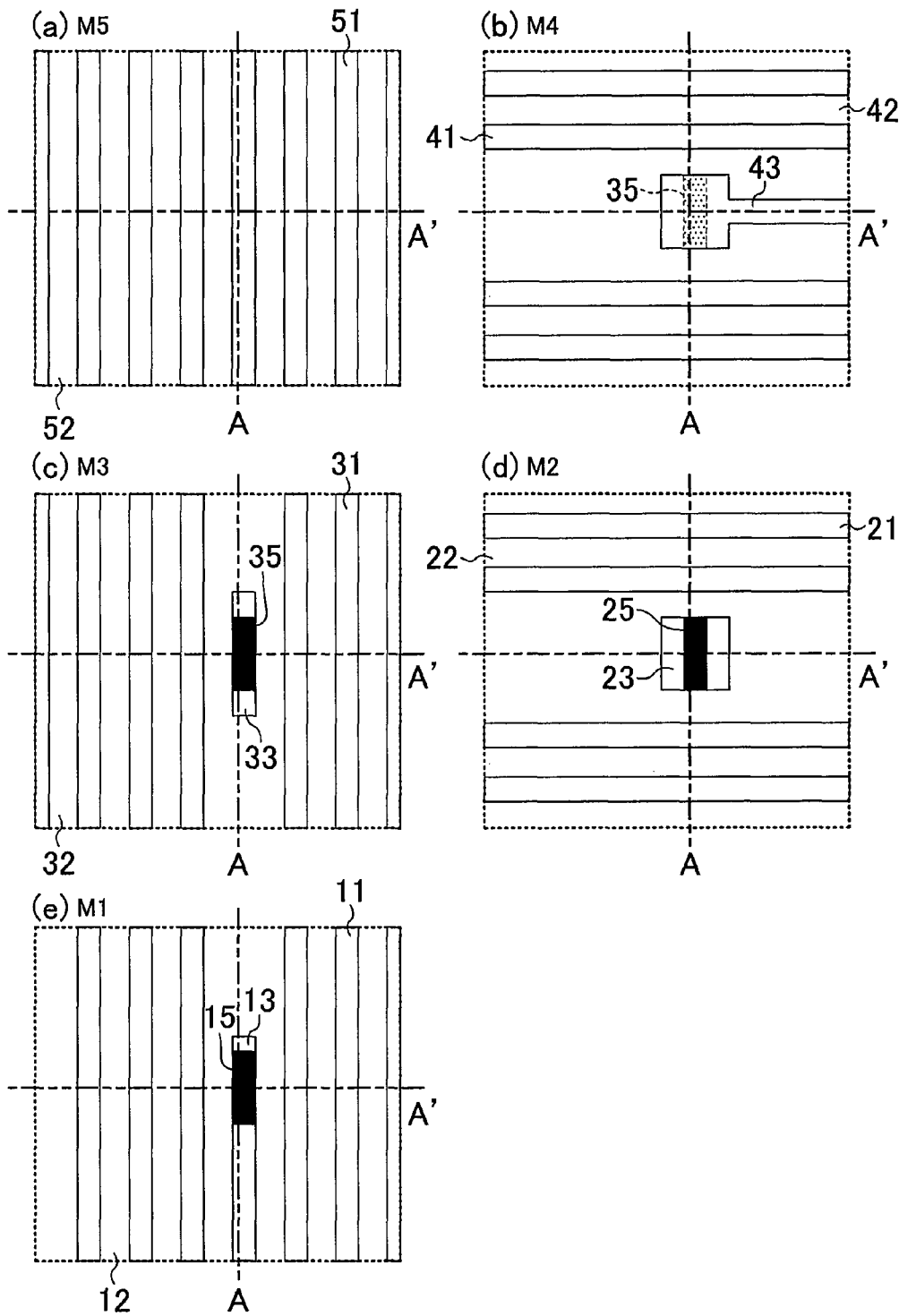
FIGS. 6A-6E are plan views illustrating a configuration of a semiconductor device according to a third embodiment.
Figure 8:
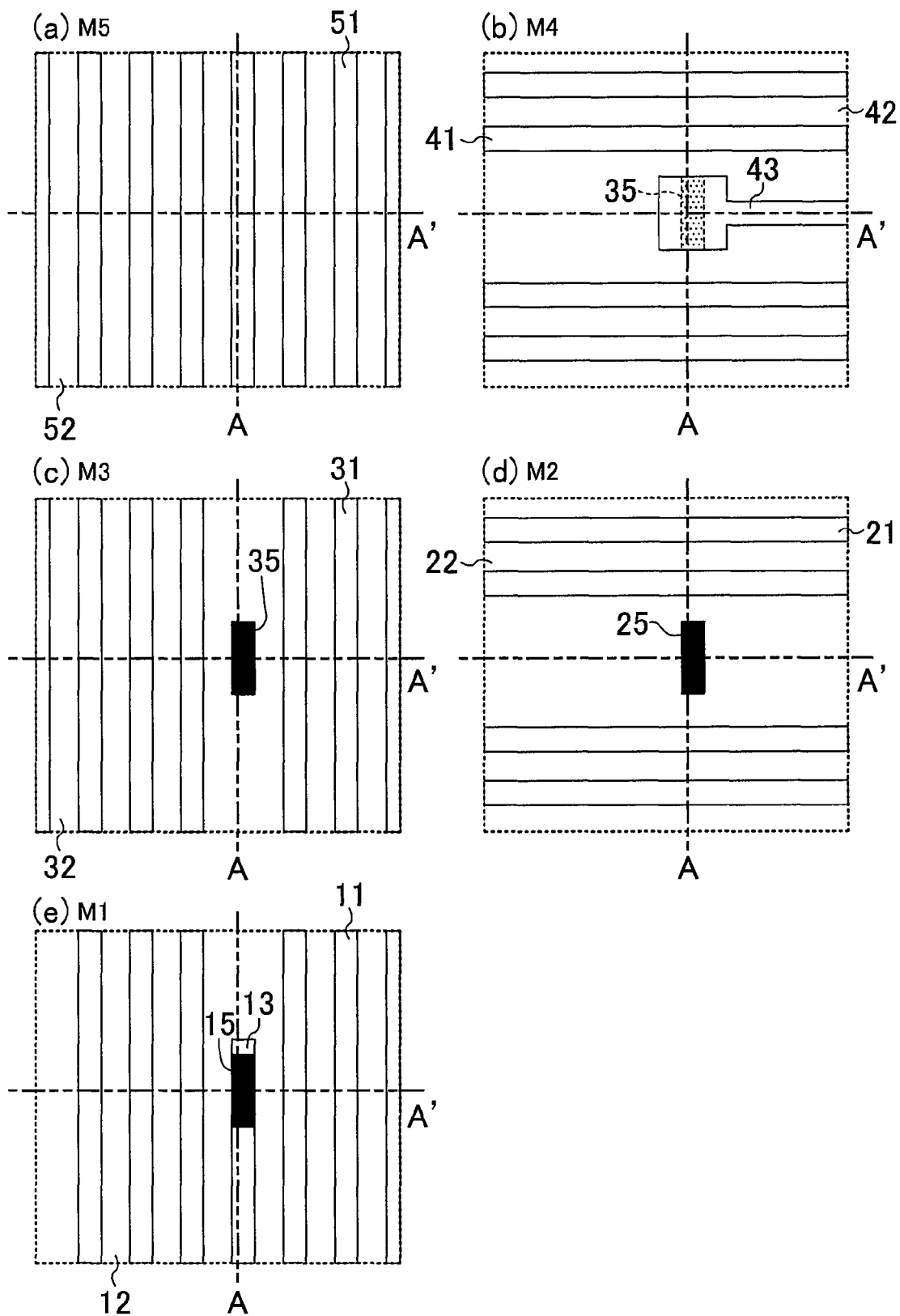
FIGS. 8A-8E are plan views illustrating a configuration of a semiconductor device according to a fourth embodiment.
Figure 10:
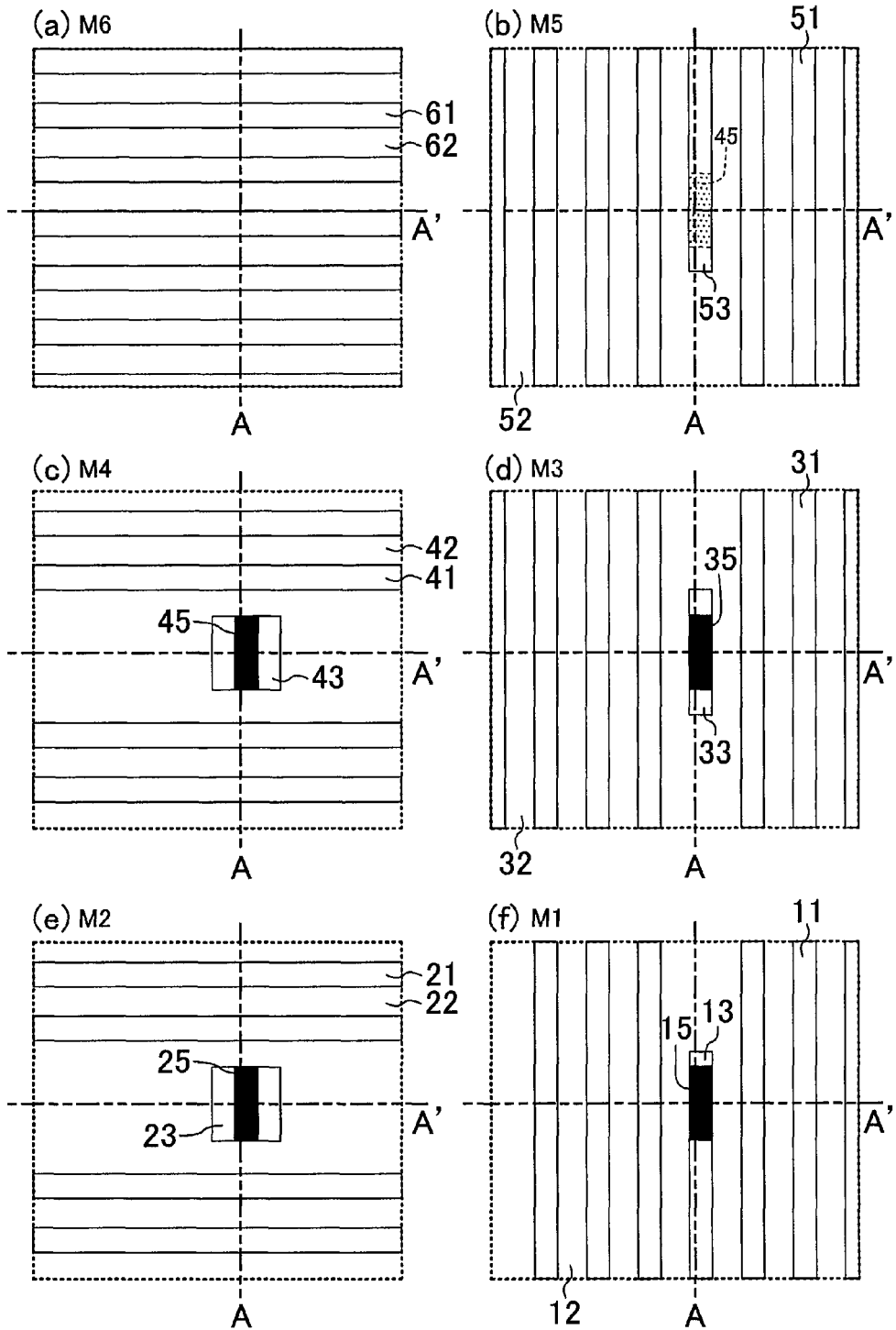
FIGS. 10A-10F are plan views illustrating a configuration of a semiconductor device according to a fifth embodiment.

Note that in the present embodiment, the intermediate interconnect 23 further extends beyond the first and second contact vias 15, 25 in the short-side direction, but this configuration does not limit the invention. For example, as illustrated in FIG. 3A, the intermediate interconnect 23 may further extend beyond the first and second contact vias 15, 25 in their long-side direction, or as illustrated in FIG. 3B, the intermediate interconnect 23 may further extend both in the short-side direction and in the long-side direction. However, as for the layout area, the intermediate interconnect preferably extends in the same direction as the interconnect direction in its interconnect layer. In this case, a region in which a contact via will be disposed is not required to be further extended for the intermediate interconnect. Thus, it is possible to avoid providing useless space.

Alternatively, the intermediate interconnect 23 may be formed to have almost the same size as that of the first and second contact vias 15, 25. However, to stabilize the conductivity of the stack structure, it is preferable that the intermediate interconnect 23 is formed to have a larger size than that of the first and second contact vias 15, 25 so that the interconnect is less likely to be broken.

Second Embodiment

A semiconductor device according to a second embodiment has a configuration almost the same as that of the semiconductor device according to the first embodiment. However, the second embodiment is different from the first embodiment in that in a stack structure of the second embodiment, an intermediate interconnect is not formed, but contact vias are directly connected to each other.

FIGS. 4A-4D are plan views illustrating a configuration of the semiconductor device according to the present embodiment, wherein FIGS. 4A-4D illustrate configurations of a fourth interconnect layer (M4), a third interconnect layer (M3), a second interconnect layer (M2), and a first interconnect layer (M1), respectively. FIGS. 5A and 5B are cross-sectional views of the semiconductor device of FIGS. 4A-4D, wherein FIG. 5A is a cross-sectional view taken along the line A, and FIG. 5B is a cross-sectional view taken along the line A'. Components in FIGS. 4A-4D, 5A, and 5B which are substantially the same as those of FIGS. 1A-1D, 2A, and 2B are denoted by the same reference symbols as those of FIGS. 1A-1D, 2A, and 2B, and detailed description thereof is omitted.

In FIGS. 4A-4D, 5A, and 5B, a first contact via 15 provided in the first interconnect layer M1 and a second contact via 25 provided in the second interconnect layer M2 are directly connected to each other without an intermediate interconnect provided therebetween. That is, the first contact via 15 is formed to electrically connect a lower-layer interconnect 13 provided in the first interconnect layer M1 to the second contact via 25. The second contact via 25 is formed to electrically connect the first contact via 15 to an upper-layer interconnect 33 provided in the third interconnect layer M3. Note that the first contact via 15 may be formed in the second interconnect layer M2, or the second contact via 25 may be formed in the third interconnect layer M3.

The shape of the first and second contact vias 15, 25 is the same as that of the first embodiment. That is, when viewed from above, the first and second contact vias 15, 25 both have a rectangular shape with their long sides extending in the same direction, and overlap with each other.

That is, the lower-layer interconnect 13, the first contact via 15, the second contact via 25, and the upper-layer interconnect 33 are stacked in this order, and are electrically connected to each other, thereby implementing a so-called stack structure.

As described above, in the present embodiment, in the stack structure in which the lower-layer interconnect 13 in the first interconnect layer M1 is connected to the upper-layer interconnect 33 in the third interconnect layer M3, the first and second contact vias 15, 25 having a rectangular shape are arranged so that they are aligned in the same direction to overlap with each other. Thus, as for the heat dissipation effect, a structure is implemented as if a wide heat dissipation line were provided between the lower-layer interconnect 13 and the upper-layer interconnect 33, thereby increasing the thermal conductivity between levels. This improves the effect of dissipating heat from the second interconnect layer M2 at an intermediate level at which heat is more likely to stay in the multilayer interconnect structure to the first interconnect layer M1 and to the third interconnect layer M3.

Note that in the first and second embodiments, it can be said that the contact vias 15, 25 preferably have a large size as for the heat dissipation effect. However, an excessively large size can lead to decrease in area efficiency and a poor yield. In view of this, for example, each of the contact vias 15, 25 preferably has the long sides whose length is 1.5 or more times that of the short sides. Alternatively, the length of the long sides is preferably 5 or less times the length of the short sides.

Moreover, in the first and second embodiments described above, the contact vias 15, 25 are identical in length of their long sides and their short sides, and overlap with each other almost entirely, but this configuration does not limit the invention. For example, the contact vias 15, 25 may be different from each other in length of at least one of the long sides and the short sides. Alternatively, the overlapped area may be about 50%, or may be 50% or more oft area of the first contact via 15.

Third Embodiment

In a semiconductor device according to a third embodiment, a multilayer interconnect structure formed above a substrate includes a first interconnect layer, a second interconnect layer, a third interconnect layer, a fourth interconnect layer, and a fifth interconnect layer which are stacked from the substrate in this order.

FIGS. 6A-6E are plan views illustrating a configuration of the semiconductor device according to the present embodiment, wherein FIGS. 6A-6E illustrate configurations of the fifth interconnect layer (M5), the fourth interconnect layer (M4), the third interconnect layer (M3), the second interconnect layer (M2), and the first interconnect layer (M1), respectively. FIGS. 7A and 7B are cross-sectional views of the semiconductor device of FIGS. 6A-6E, wherein FIG. 7A is a cross-sectional view taken along the line A, and FIG. 7B is a cross-sectional view taken along the line A'.

In FIGS. 7A and 7B, reference numeral 1 denotes a well region forming a diffusion layer of a transistor, the well region being made of, for example, silicon on a surface of the substrate. Reference numeral 2 denotes an insulating layer made of, for example, silicon oxide to electrically isolate the well region 1 from the interconnect layers. On the insulating layer 2, the five interconnect layers M1-M5 are formed.

As illustrated in FIGS. 6A-6E, 7A, and 7B, interconnects 11, 21, 31, 41, 51 made of, for example, Cu are provided in the interconnect layers M1-M5, respectively. Note that in the present embodiment, the interconnect direction is the longitudinal direction for the interconnect layers M1, M3, M5, and is the transverse direction for the interconnect layers M2, M4. Moreover, in order to electrically isolate the interconnects from each other, insulating layers 12, 22, 32, 42, 52 made of, for example, silicon oxide are provided in the interconnect layers M1-M5, respectively.

Moreover, a first contact via 15, a second contact via 25, and a third contact via 35 which are made of, for example, Cu are provided in the first, second, and third interconnect layers M1, M2, M3, respectively. The first contact via 15 is formed to electrically connect a lower-layer interconnect 13 formed in the first interconnect layer M1 to an intermediate interconnect 23 formed in the second interconnect layer M2. The second contact via 25 is formed to electrically connect the intermediate interconnect 23 to an intermediate interconnect 33 formed in the third interconnect layer M3. The third contact via 35 is formed to electrically connect the intermediate interconnect 33 to an upper-layer interconnect 43 formed in the fourth interconnect layer M4. That is, in order to electrically connect the lower-layer interconnect 13 to the upper-layer interconnect 43, the contact vias 15, 25, 35 are formed in the interconnect layers M1-M3, respectively. Note that the first contact via 15 may be formed in the second interconnect layer M2, the second contact via 25 may be formed in the third interconnect layer M3, or the third contact via 35 may be formed in the fourth interconnect layer M4.

When viewed from above, the first, second, and third contact vias 15, 25, 35 all have a rectangular shape, and their long sides extend in the same direction. In the present embodiment, the direction in which the long sides extend is the same as the interconnect direction of the first and third interconnect layers M1, M3, and is orthogonal to the interconnect direction of the second and fourth interconnect layers M2, M4. Moreover, when viewed from above, the contact vias 15, 25, 35 overlap with each other. In the present embodiment, the contact vias 15, 25, 35 are identical in length of their long sides and their short sides, and overlap with each other almost entirely.

Moreover, when viewed from above, the intermediate interconnect 23 further extends beyond the contact vias 15, 25, 35 in their short-side direction, i.e., in a direction orthogonal to their long-side direction. Moreover, when viewed from above, the intermediate interconnect 33 further extends beyond the contact vias 15, 25, 35 in their long-side direction. That is, the intermediate interconnects 23, 33 extend in the same direction as the interconnect direction in the interconnect layers M2, M3, respectively.

That is, the lower-layer interconnect 13, the first contact via 15, the intermediate interconnect 23, the second contact via 25, the intermediate interconnect 33, the third contact via 35, and the upper-layer interconnect 43 are stacked in this order, and are electrically connected to each other, thereby implementing a so-called stack structure. This stack structure is a structure in which the contact via 35 and the interconnect 43 are further stacked on the upper-layer interconnect 33 of the stack structure described in the first embodiment.

As described above, in the present embodiment, in the stack structure in which the lower-layer interconnect 13 in the first interconnect layer M1 is connected to the upper-layer interconnect 43 in the fourth interconnect layer M4, the contact vias 15, 25, 35 having a rectangular shape are arranged so that they are aligned in the same direction to overlap with each other. Thus, as for the heat dissipation effect, a structure is implemented as if a wide heat dissipation line were provided between the lower-layer interconnect 13 and the upper-layer interconnect 43, thereby increasing the thermal conductivity between levels. This improves the effect of dissipating heat from the second and third interconnect layers M2, M3 at an intermediate level at which heat is more likely to stay in the multilayer interconnect structure to the first interconnect layer M1 and to the fourth interconnect layer M4.

Moreover, since the intermediate interconnects 23, 33 further extend beyond the contact vias 15, 25, 35, the thermal conductivity is further increased, further improving the heat dissipation effect by the stack structure.

Fourth Embodiment

A semiconductor device according to a fourth embodiment has a configuration almost the same as that of the semiconductor device according to the third embodiment. However, the fourth embodiment is different from the third embodiment in that in a stack structure of the fourth embodiment, an intermediate interconnect is not formed, but contact vias are directly connected to each other.

FIGS. 8A-8E are plan views illustrating a configuration of the semiconductor device according to the present embodiment, wherein FIGS. 8A-8E illustrate configurations of a fifth interconnect layer (M5), a fourth interconnect layer (M4), a third interconnect layer (M3), a second interconnect layer (M2), and a first interconnect layer (M1), respectively. FIGS. 9A and 9B are cross-sectional views of the semiconductor device of FIGS. 8A-8E, wherein FIG. 9A is a cross-sectional view taken along the line A, and FIG. 9B is a cross-sectional view taken along the line A'. Components in FIGS. 8A-8E, 9A, and 9B which are substantially the same as those of FIGS. 6A-6E, 7A, and 7B are denoted by the same reference symbols as those of FIGS. 6A-6E, 7A, and 7B, and detailed description thereof is omitted.

In FIGS. 8A-8E, 9A, and 9B, a first contact via 15 provided in the first interconnect layer M1 and a second contact via 25 provided in the second interconnect layer M2 are directly connected to each other without an intermediate interconnect provided therebetween. Moreover, the second contact via 25 and a third contact via 35 provided in the third interconnect layer M3 are directly connected to each other without an intermediate interconnect provided therebetween. That is, the first contact via 15 is formed to electrically connect a lower-layer interconnect 13 provided in the first interconnect layer M1 to the second contact via 25. The second contact via 25 is formed to electrically connect the first contact via 15 to the third contact via 35. The third contact via 35 is formed to electrically connect the second contact via 25 to an upper-layer interconnect 43 provided in the fourth interconnect layer M4. That is, in order to electrically connect the lower-layer interconnect 13 to the upper-layer interconnect 43, the contact vias 15, 25, 35 are formed in the interconnect layers M1-M3, respectively. Note that the first contact via 15 may be formed in the second interconnect layer M2, the second contact via 25 may be formed in the third interconnect layer M3, or the third contact via 35 may be formed in the fourth interconnect layer M4.

The shape of the first, second, and third contact vias 15, 25, 35 is the same as that of the third embodiment. That is, when viewed from above, the first and second contact vias 15, 25, 35 all have a rectangular shape with their long sides extending in the same direction, and overlap with each other.

That is, the lower-layer interconnect 13, the first contact via 15, the second contact via 25, the third contact via 35, and the upper-layer interconnect 43 are stacked in this order, and are electrically connected to each other, thereby implementing a so-called stack structure. This stack structure is a structure in which the contact via 35 and the interconnect 43 are stacked instead of the upper-layer interconnect 33 of the stack structure described in the second embodiment.

As described above, in the present embodiment, in the stack structure in which the lower-layer interconnect 13 in the first interconnect layer M1 is connected to the upper-layer interconnect 43 in the fourth interconnect layer M4, the first, second, and third contact vias 15, 25, 35 having a rectangular shape are arranged so that they are aligned in the same direction to overlap with each other. Thus, as for the heat dissipation effect, a structure is implemented as if a wide heat dissipation line were provided between the lower-layer interconnect 13 and the upper-layer interconnect 43, thereby increasing the thermal conductivity between levels. This improves the effect of dissipating heat from the second and third interconnect layers M2, M3 at an intermediate level at which heat is more likely to stay in the multilayer interconnect structure to the first interconnect layer M1 and to the fourth interconnect layer M4.

Note that in the third and fourth embodiments, it can be said that the contact vias 15, 25, 35 preferably have a large size as for the heat dissipation effect. However, an excessively large size can lead to decrease in area efficiency and also a poor yield. In view of this, for example, each of the contact vias 15, 25, 35 preferably has the long sides whose length is 1.5 or more times that of the short sides. Alternatively, the length of the long sides is preferably 5 or less times the length of the short sides.

Moreover, in the third and fourth embodiments described above, the contact vias 15, 25, 35 are identical in length of their long sides and their short sides, and overlap with each other almost entirely, but this configuration does not limit the invention. For example, the contact vias 15, 25, 35 may be different from each other in length of at least one of the long sides and the short sides. Alternatively, the overlapped area may be about 50%, or may be 50% or more of the area of the first contact via 15.

Fifth Embodiment

In a semiconductor device according to a fifth embodiment, a multilayer interconnect structure formed above a substrate includes a first interconnect layer, a second interconnect layer, a third interconnect layer, a fourth interconnect layer, a fifth interconnect layer, and a sixth interconnect layer which are stacked from the substrate side in this order.

FIGS. 10A-10F are plan views illustrating a configuration of the semiconductor device according to the present embodiment, wherein FIGS. 10A-10F illustrate configurations of the sixth interconnect layer (M6), the fifth interconnect layer (M5), the fourth interconnect layer (M4), the third interconnect layer (M3), the second interconnect layer (M2), and the first interconnect layer (M1), respectively. FIGS. 11A and 11B are cross-sectional views of the semiconductor device of FIGS. 10A-10F, wherein FIG. 11A is a cross-sectional view taken along the line A, and FIG. 11B is a cross-sectional view taken along the line A'.

In FIGS. 11A and 11B, reference numeral 1 denotes a well region forming a diffusion layer of a transistor, the well region being made of, for example, silicon on a surface of the substrate. Reference numeral 2 denotes an insulating layer made of, for example, silicon oxide to electrically isolate the well region 1 from the interconnect layers. On the insulating layer 2, the six interconnect layers M1-M6 are formed.

As illustrated in FIGS. 10A-10F, 11A, and 11B, interconnects 11, 21, 31, 41, 51, 61 made of, for example, Cu are provided in the interconnect layers M1-M6, respectively. Note that in the present embodiment, the interconnect direction is the longitudinal direction for the interconnect layers M1, M3, M5, and is the transverse direction for the interconnect layers M2, M4, M6. Moreover, in order to electrically isolate the interconnects from each other, insulating layers 12, 22, 32, 42, 52, 62 made of, for example, silicon oxide are provided in the interconnect layers M1-M6, respectively.

Moreover, a first contact via 15, a second contact via 25, a third contact via 35, and a fourth contact via 45 which are made of, for example, Cu are provided in the interconnect layers M1, M2, M3, M4, respectively. The first contact via 15 is formed to electrically connect a lower-layer interconnect 13 formed in the first interconnect layer M1 to an intermediate interconnect 23 formed in the second interconnect layer M2. The second contact via 25 is formed to electrically connect the intermediate interconnect 23 to an intermediate interconnect 33 formed in the third interconnect layer M3. The third contact via 35 is formed to electrically connect the intermediate interconnect 33 to an intermediate interconnect 43 formed in the fourth interconnect layer M4. The fourth contact via 45 is formed to electrically connect the intermediate layer 43 to an upper-layer interconnect 53 formed in the fifth interconnect layer M5. That is, in order to electrically connect the lower-layer interconnect 13 to the upper-layer interconnect 53, the contact vias 15, 25, 35, 45 are formed in the interconnect layers M1-M4, respectively. Note that the first contact via 15 may be formed in the second interconnect layer M2, the second contact via 25 may be formed in the third interconnect layer M3, the third contact via 35 may be formed in the fourth interconnect layer M4, or the fourth contact via 45 may be formed in the fifth interconnect layer M5.

When viewed from above, the first, second, third, and fourth contact vias 15, 25, 35, 45 all have a rectangular shape, and their long sides extend in the same direction. In the present embodiment, the direction in which the long sides extend is the same as the interconnect direction of the first, third, and fifth interconnect layers M1, M3, M5, and is orthogonal to the interconnect direction of the second and fourth interconnect layers M2, M4. Moreover, when viewed from above, the contact vias 15, 25, 35, 45 overlap with each other. In the present embodiment, the contact vias 15, 25, 35, 45 are identical in length of their long sides and their short sides, and overlap with each other almost entirely.

Moreover, when viewed from above, the intermediate interconnects 23, 43 further extend beyond the contact vias 15, 25, 35, 45 in their short-side direction, i.e., in a direction orthogonal to their long-side direction. Moreover, when viewed from above, the intermediate interconnect 33 further extends beyond the contact vias 15, 25, 35, 45 in their long-side direction. That is, the intermediate interconnects 23, 33, 43 extend in the same direction as the interconnect direction in the interconnect layers M2, M3, M4 respectively.

That is, the lower-layer interconnect 13, the first contact via 15, the intermediate interconnect 23, the second contact via 25, the intermediate interconnect 33, the third contact via 35, the intermediate interconnect 43, the fourth contact via 45, and the upper-layer interconnect 53 are stacked in this order, and are electrically connected to each other, thereby implementing a so-called stack structure. This stack structure is a structure in which the contact vias 35, 45 and the interconnects 43, 53 are further stacked on the upper-layer interconnect 33 of the stack structure described in the first embodiment.

As described above, in the present embodiment, in the stack structure in which the lower-layer interconnect 13 in the first interconnect layer M1 is connected to the upper-layer interconnect 53 in the fifth interconnect layer M5, the contact vias 15, 25, 35, 45 having a rectangular shape are arranged so that they are aligned in the same direction to overlap with each other. Thus, as for the heat dissipation effect, a structure is implemented as if a wide heat dissipation line were provided between the lower-layer interconnect 13 and the upper-layer interconnect 53, thereby increasing the thermal conductivity between levels. This improves the effect of dissipating heat from the second, third, and fourth interconnect layers M2, M3, M4 at an intermediate level at which heat is more likely to stay in the multilayer interconnect structure to the first interconnect layer M1 and to the fifth interconnect layer M5.

Moreover, since the intermediate interconnects 23, 33, 43 further extend beyond the contact vias 15, 25, 35, 45, the thermal conductivity is further increased, further improving the heat dissipation effect by the stack structure.

Sixth Embodiment

A semiconductor device according to a sixth embodiment has a configuration almost the same as that of the semiconductor device according to the fifth embodiment. However, the sixth embodiment is different from the fifth embodiment in that in a stack structure of the sixth embodiment, an intermediate interconnect is not formed, but contact vias are directly connected to each other.

FIGS. 12A-12F are plan views illustrating a configuration of the semiconductor device according to the present embodiment, wherein FIGS. 12A-12F illustrate configurations of a sixth interconnect layer (M6), a fifth interconnect layer (M5), a fourth interconnect layer (M4), a third interconnect layer (M3), a second interconnect layer (M2), and a first interconnect layer (M1), respectively. FIGS. 13A and 13B are cross-sectional views of the semiconductor device of FIGS. 12A-12F, wherein FIG. 13A is a cross-sectional view taken along the line A, and FIG. 13B is a cross-sectional view taken along the line A'. Components in FIGS. 12A-12F, 13A, and 13B which are substantially the same as those of FIGS. 10A-10F, 11A, and 11B are denoted by the same reference symbols as those of FIGS. 10A-10F, 11A, and 11B, and detailed description thereof is omitted.

In FIGS. 12A-12F, 13A, and 13B, a first contact via 15 provided in the first interconnect layer M1 and a second contact via 25 provided in the second interconnect layer M2 are directly connected to each other without an intermediate interconnect provided therebetween. Moreover, the second contact via 25 and a third contact via 35 provided in the third interconnect layer M3 are directly connected to each other without an intermediate interconnect provided therebetween. The third contact via 35 and a fourth contact via 45 provided in the fourth interconnect layer M4 are connected to each other without an intermediate interconnect provided therebetween. That is, the first contact via 15 is formed to electrically connect a lower-layer interconnect 13 provided in the first interconnect layer M1 to the second contact via 25. The second contact via 25 is formed to electrically connect the first contact via 15 to the third contact via 35. The third contact via 35 is formed to electrically connect the second contact via 25 to the fourth contact via 45. The fourth contact via 45 is formed to electrically connect the third contact via 35 to an upper-layer interconnect 53 provided in the fifth interconnect layer M5. That is, in order to electrically connect the lower-layer interconnect 13 to the upper-layer interconnect 53, the contact vias 15, 25, 35, 45 are formed in the interconnect layers M1-M4, respectively. Note that the first contact via 15 may be formed in the second interconnect layer M2, the second contact via 25 may be formed in the third interconnect layer M3, the third contact via 35 may be formed in the fourth interconnect layer M4, or the fourth contact via 45 may be formed in the fifth interconnect layer M5.

The shape of the first, second, third, and fourth contact vias 15, 25, 35, 45 is the same as that of the fifth embodiment. That is, when viewed from above, the first, second, third, and fourth contact vias 15, 25, 35, 45 all have a rectangular shape with their long sides extending in the same direction, and overlap with each other.

That is, the lower-layer interconnect 13, the first contact via 15, the second contact via 25, the third contact via 35, the fourth contact via 45, and the upper-layer interconnect 53 are stacked in this order, and are electrically connected to each other, thereby implementing a so-called stack structure. This stack structure is a structure in which the contact via 45 and the interconnect 53 are stacked instead of the upper-layer interconnect 43 of the stack structure described in the fourth embodiment.

As described above, in the present embodiment, in the stack structure in which the lower-layer interconnect 13 in the first interconnect layer M1 is connected to the upper-layer interconnect 53 in the fifth interconnect layer M5, the contact vias 15, 25, 35, 45 having a rectangular shape are arranged so that they are aligned in the same direction to overlap with each other. Thus, as for the heat dissipation effect, a structure is implemented as if a wide heat dissipation line were provided between the lower-layer interconnect 13 and the upper-layer interconnect 53, thereby increasing the thermal conductivity between levels. This improves the effect of dissipating heat from the second, third, and fourth interconnect layers M2, M3, M4 at an intermediate level at which heat is more likely to stay in the multilayer interconnect structure to the first interconnect layer M1 and to the fifth interconnect layer M5.

Note that in the fifth and sixth embodiments, it can be said that the contact vias 15, 25, 35, 45 preferably have a large size as for the heat dissipation effect. However, an excessively large size can lead to decrease in area efficiency and also a poor yield. In view of this, for example, each of the contact vias 15, 25, 35, 45 preferably has the long sides whose length is 1.5 or more times that of the short sides. Alternatively, the length of the long sides is preferably 5 or less times the length of the short sides.

Moreover, in the fifth and sixth embodiments described above, the contact vias 15, 25, 35, 45 are identical in length of their long sides and their short sides, and overlap with each other almost entirely, but this configuration does not limit the invention. For example, the contact vias 15, 25, 35, 45 may be different from each other in length of at least one of the long sides and the short sides. Alternatively, the overlapped area may be about 50%, or may be 50% or more of the area of the first contact via 15.

Note that in the embodiments described above, the interconnect directions in the interconnect layers are alternately the longitudinal direction, the transverse direction, the longitudinal direction, . . . , but this configuration does not limit the present invention. For example, a configuration in which the interconnect direction is the longitudinal direction for the interconnect layers M1, M2, and the interconnect direction is the transverse direction for the interconnect layers M3, M4 in FIGS. 1A-1D may be possible.

Note that in the embodiments described above, the interconnects are made of Cu, but this does not limit the invention. The interconnects may be made of other low-resistance materials. Moreover, the contact vias may be made of other low-resistance materials than Cu.

Moreover, in the embodiments described above, the insulating layers are made of silicon oxide, but this does not limit the present invention. The insulating layers may be made of other low dielectric constant materials.

In the present invention, the effect of dissipating heat from the intermediate level of a multilayer interconnect structure is improved, so that the present invention is useful to improve the yield and performance of, for example, semiconductor devices.

What is claimed is:

1. A semiconductor device comprising a multilayer interconnect structure which is formed above a substrate and includes first to Nth interconnect layers, where N is an integer equal to or larger than 4, stacked from the substrate in this order, the semiconductor device comprising:

a lower-layer interconnect formed in the first interconnect layer;

an intermediate interconnect formed in the second interconnect layer;

an upper-layer interconnect formed in the (N−1)th interconnect layer;

a first contact via formed to electrically connect the lower-layer interconnect to the intermediate interconnect; and a second contact via formed to electrically connect the intermediate interconnect to the upper-layer interconnect, wherein when viewed from above, the first contact via and the second contact via both have a rectangular shape with their long sides extending in a same first direction parallel to a longitudinal axis of the lower-layer interconnect, and overlap with each other, and wherein a dimension of the intermediate interconnect extending in the first direction is equal to or greater than a length of the long sides of each of the first contact via and the second contact via.

2. The semiconductor device of claim 1, wherein the lower-layer interconnect and the upper-layer interconnect both extend in the first direction, and wherein a dimension of the intermediate interconnect extending in a second direction orthogonal to the first direction is equal to or greater than a length of short sides of each of the first contact via and the second contact via.

3. The semiconductor device of claim 1, wherein the lower-layer interconnect and the upper-layer interconnect both extend in the first direction.

4. The semiconductor device of claim 1, wherein each of the first contact via and the second contact via has the long sides whose length is 1.5 or more times that of short sides.

5. The semiconductor device of claim 1, wherein each of the first contact via and the second contact via has the long sides whose length is 5 or less times that of short sides.

6. The semiconductor device of claim 1, wherein the first contact via and the second contact via are identical in length of the long sides and short sides.

7. The semiconductor device of claim 1, wherein the first contact via and the second contact via are different from each other in length of at least one of the long sides and short sides.

8. The semiconductor device of claim 1, wherein when viewed from above, an area where the second contact via overlaps with the first contact via is 50% or more of an area of the first contact via.

* * * * *